Figure 1:
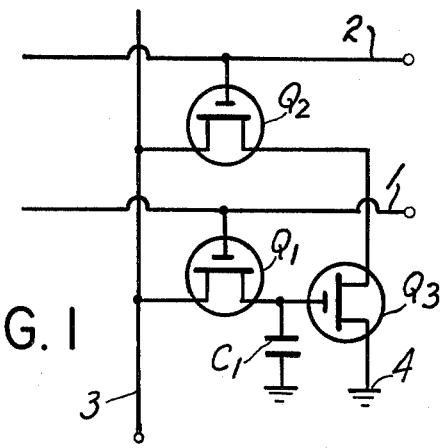

United States Patent [19]
Fujimoto

[11] 4,084,108
[45] Apr. 11, 1978

[54] INTEGRATED CIRCUIT DEVICE

[75] Inventor: Shoji Fujimoto, Tokyo, Japan

[73] Assignee: Nippon Electric Co., Ltd., Tokyo, Japan

[21] Appl. No.: 628,463

[22] Filed: Nov. 4, 1975

[30] Foreign Application Priority Data

Nov. 9, 1974   Japan .................. 49-129222

[51] Int. Cl.² .................. H01L 29/78; H01L 29/60; G11C 11/24; G11C 11/40
[52] U.S. Cl. .................. 307/238; 307/304; 357/23; 357/41; 357/59; 365/150; 365/182; 365/187
[58] Field of Search .................. 357/23, 24, 41, 42; 307/238, 304; 340/173 CA

[56] References Cited

U.S. PATENT DOCUMENTS

| 3,436,623 | 4/1969 | Beer ................... 357/23 |
| 3,585,613 | 6/1971 | Palfi .................. 357/41 |
| 3,593,037 | 7/1971 | Hoff ................... 307/238 |
| 3,691,537 | 9/1972 | Burgess et al. ......... 307/279 |
| 3,720,922 | 3/1973 | Kosonocky ............. 357/24 |
| 3,810,125 | 5/1974 | Stein .................. 357/24 |
| 3,891,190 | 6/1975 | Vadasz ................. 357/41 |

Primary Examiner—William D. Larkins
Attorney, Agent, or Firm—Hopgood, Calimafde, Kalil, Blaustein & Lieberman

[57] ABSTRACT

A semiconductor integrated circuit 3 transistor/bit cell includes two MOS transistors having superposed and insulated gate electrodes overlying the substrate at the portion between the diffused regions, so that the memory can be fabricated in a reduced area.

3 Claims, 21 Drawing Figures

INTEGRATED CIRCUIT DEVICE

This invention relates to semiconductor integrated circuit devices, and more particularly, to integrated circuit (IC) structures suited for 3 transistor/bit dynamic memory cells.

Memory cells using insulated-gate field effect transistors are known; of these memory cells the 3 transistor/bit dynamic memory cell is widely used. Although this type of memory cell can be fabricated into a small size by integration, several problems must still be solved, especially with respect to the space occupied by the memory cell an integrated circuit device and to its operating speed.

It is therefore an object of the invention to provide a 3 transistor/bit memory cell that occupies a minimum amount of space in an integrated circuit device.

It is another object of the invention to provide a 3 transistor/bit memory cell having a high operating speed, especially of high speed read-out.

A semiconductor integrated circuit device according to the present invention comprises a semiconductor substrate of a first conductivity type, in which first, second, third and fourth regions of a second conductivity type are formed on one major surface. A first insulating film is formed on the surface of the substrate between the first and second regions, a first gate electrode is formed on the first insulating film, and a second insulating film is formed on the surface of the substrate between the third and fourth regions. A second gate electrode is formed on the second insulating film and extends from a portion above the edge of the third region to a portion above a middle of the surface of the substrate between the third and fourth regions, and a third gate electrode is formed on the second insulating film and extends from a portion above the edge of the fourth region to a portion above a middle of the surface of the substrate between the third and fourth regions. The second and third gate electrodes are thus partly superposed on together with a third insulating film interposed therebetween. The second region is connected to the second gate electrode.

In this construction, the first and fourth regions may be connected to a digit line, the first gate electorde to a write address line, and the third gate electrode to a read address line. Data on the digit line are stored in the capacitance attached to the second gate electrode.

This construction makes it possible to reduce the area occupied by the two transistors in an integrated circuit device. Furthermore, the partly superposed gate electrodes provide a capacitance therebetween, which permits the achievement of faster data read cycle time. Still further, the threshold voltages of the read transistor composed on the fourth region and the third gate electrode and the data memory transistor composed of the third region and the second gate electrode can be set respectively to desired values.

Further objects, features and advantages of the invention will become more apparent from the following description when read in conjunction with the accompanying drawings. For the sake of explanation, a memory cell using n-channel MOS (metal oxide semi-conductor) transistors will be described. It is apparent that other types of insulated-gate field effect transistors may readily be used for the purpose of the invention.

Figure 8:
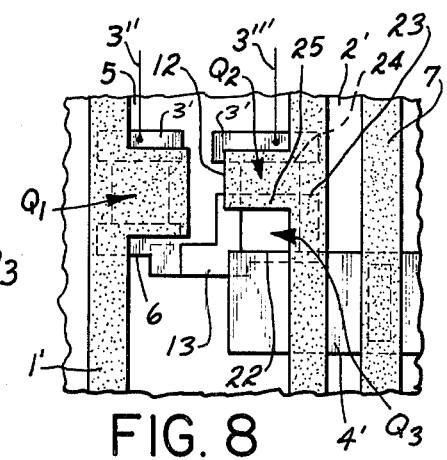
Figure 2A:
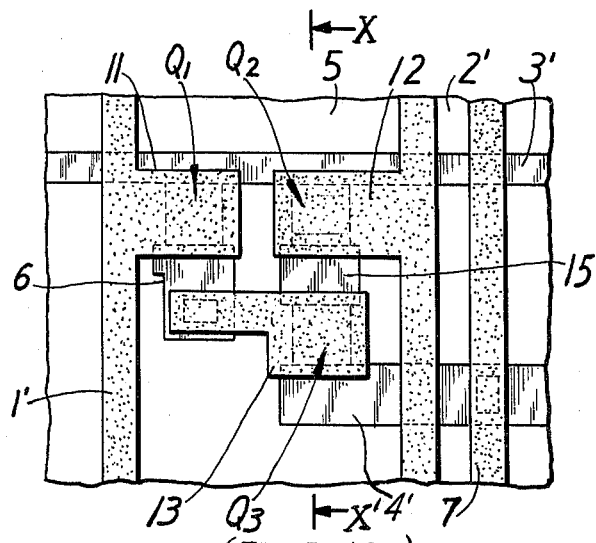
Figure 2B:
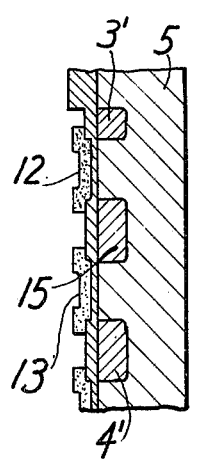
Figure 3A:
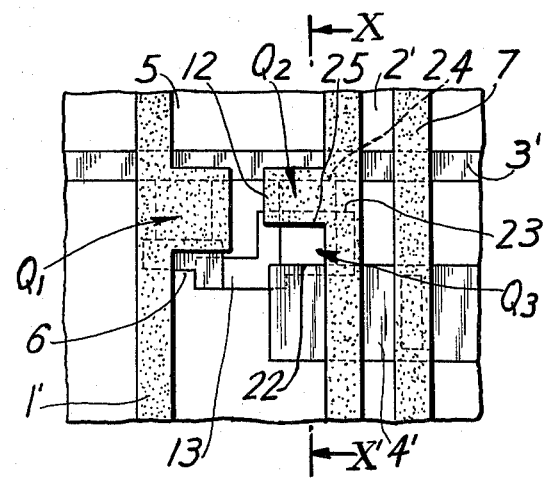
Figure 3B:
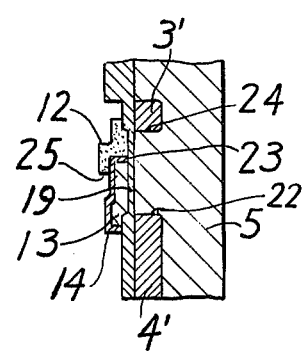
Figure 4A:
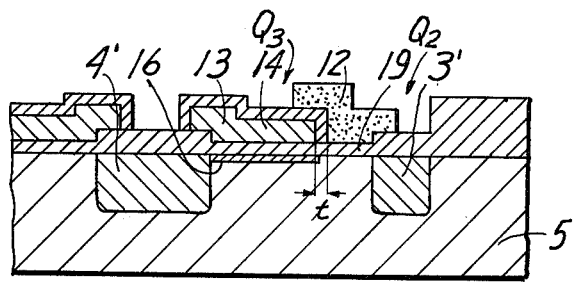
Figure 4B:
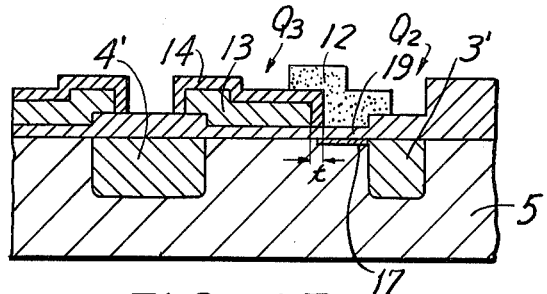
Figure 4C:
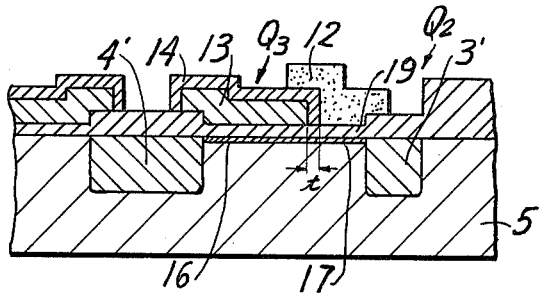
Figure 5A:
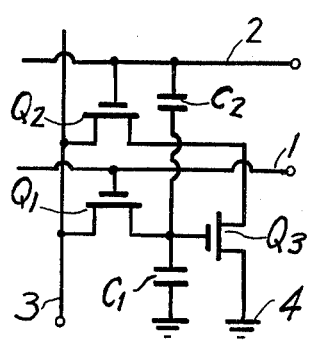
Figure 5B:
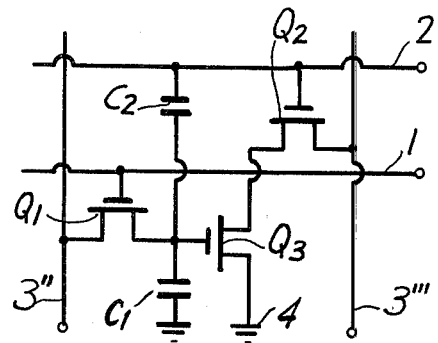

FIG. 1 is a circuit diagram of a conventional 3 transistor/bit dynamic memory cell;

FIG. 2A is a plan view and FIG. 2B is a cross-sectional view, taken along line X—X' of FIG. 2A, showing the structure of a prior art 3 transistor/bit memory cell IC device, FIG. 3A is a plan view and FIG. 3B is a cross-sectional view showing the structure of a 3 transistor/bit memory cell according to an embodiment of the invention, FIGS. 4A to 4C are cross-sectional views illustrating the operation of the integrated circuit memory device of the invention, FIGS. 5A and 5B are equivalent circuit diagrams of the devices shown in FIG. 4, and FIGS. 6A to 6E and 7A to 7E are cross-sectional views showing methods of fabricating the integrated circuit memory device of the invention;

FIG. 8 is a plan view of a structure for implementing the circuit of FIG. 5B.

With reference to FIG. 1, a 3 transistor/bit memory cell comprises a write transistor $Q_1$, a read transistor $Q_2$, and a data storage transistor $Q_3$. The transistors $Q_1$ and $Q_2$ have their gates connected to a write address line 1 and a read address line 2, respectively, and are driven through these lines. Through a digit line 3 common for write and read data and through the transistor $Q_1$, information is stored as a charge across a capacitance $C_1$ which is parasitic on the gate electrode of the transistor $Q_3$. The stored data depend upon whether or not a charge is present across the capacitance $C_1$ after the transistor $Q_1$ has turned off. Whether the transistor $Q_3$ is in its on state of off state depends upon whether a charge is present or absent across the capacitance $C_1$. A read cycle is effected by turning on the transistor $Q_2$ and thereby causing a current to flow from the digit line 3 to ground through the source-drain paths of transistors $Q_2$ and $Q_3$.

When a charge is supplied through the transistor $Q_1$ to the capacitance $C_1$ at a write cycle, the transistor $Q_3$ is held in the on state. Thus, by turning on the transistor $Q_2$ at a read cycle, a current flows from the digit line 3 to ground through the transistors $Q_2$ and $Q_3$. But this current will now flow if no charge is given through the transistor $Q_1$ to the capacitance $C_1$ at a write cycle. In other words, the data output "1" or "0" is obtained according to whether or not a current flows through the digit line 3 and transistors $Q_2$ and $Q_3$.

FIGS. 2A and 2B show the structure of a prior art IC comprising the 3 transistor/bit dynamic memory cell of FIG. 1. As shown in FIG. 2A, the ground line 4 and the digit line 3 are respectively constituted of regions 4' and 3' formed on a single-crystal semiconductor substrate 5 by a selective impurity-diffusion or ion-implantation technique and having a conductivity type opposite to that of the substrate 5. A write address line 1' and a read address line 2' are constituted of aluminum. The transistor $Q_1$ has a gate electrode 11 formed with the write address line 1', the transistor $Q_2$ has a gate electrode 12 formed with the read address line 2', and the transistor $Q_3$ has a gate electrode 13 connected to the source region 6 of the transistor $Q_1$. The source region of the transistor $Q_3$ is constituted of a region 4' which serves also as the ground line connected to an aluminum conductor 7. The region 15 is common to transistors $Q_2$ and $Q_3$.

In this construction of dynamic memory cell, the size of a the memory cell depends upon the size of the serially connected transistors $Q_2$ and $Q_3$. More specifically, the sum of the widths of the gate electrodes 12 and 13 and the length required to isolate the gate electrodes 12 and 13 from each another determines the distance between the digit line 3' and the ground line 4' which, in turn, determines the size of the memory cell.

FIGS. 3A and 3B is a plan view, and 3B a cross-sectional view showing an embodiment of the invention applied to the memory circuit shown in FIG. 1. The widths of the wiring regions and the distances between them in the structure shown in FIG. 3 are similar to those of the structure shown in FIG. 2.

In the structure shown in FIG. 3, regions 3' and 4' are formed on the surface of a single-crystal semiconductor substrate 5 by selective impurity-diffusion or ion-implantation technique and having a conductivity type opposite to that of the substrate 5. These regions correspond to the digit line and the grounding line respectively. A gate insulating layer 19 is formed on the substrate 5 between the regions 3' and 4'.

As seen best in FIG. 3B, the gate electrode 13 is formed on the insulating layer 19 so as to extend from an area above and slightly to the left (as viewed in the Figure) of the edge of the PN junction 22 of the region 4' confronting the region 3', to an area or end portion 23 above an intermediate portion of the surface of the substrate 5 between the regions 3' and 4' 4', which, as shown in FIG. 3B, is somewhat closer to the region 3 than it is to the region 4'. The gate electrode 12 is formed on the insulating layer 19 and extends from an area above and slightly to the right (as viewed in FIG. 3B) of the edge of the PN junction 24 of the region 3' confronting the region 4' to an area or end portion 25 above the surface of the substrate 5 that is intermediate the regions 3' and 4'. Between the end portions 23 and 25, the gate electrodes 12 and 13 are superposed on each another and an insulating film 14, which electrically isolates the electrodes 12 and 13 from one another, is interposed therebetween. Thus the region 15 (FIG. 2) in common for the two serially connected transistors $Q_2$ and $Q_3$ in the prior art integrated circuit is eliminated, with the result that the area required by the memory cell is reduced to about half that required by the prior art one shown in FIG. 2.

The write transistor $Q_1$ is of the same structure as the known MOS transistor. Source and drain regions are formed on the substrate 5, a gate insulating film is formed on the substrate between the two regions, and an aluminum electrode to serve as the gate electrode is formed on the gate insulating film. The source region is connected to the gate electrode of the transistor $Q_3$; the drain region, to the digit line 3'; and the gate electrode, to the write address line 1', respectively.

FIGS. 4A to 4C show the states of the substrate surface under the gate electrodes corresponding to the on and off states of the transistors $Q_2$ and $Q_3$ of the memory cell according to the invention. In FIG. 4A, when the transistor $Q_3$ is in the on state and the transistor $Q_2$ is in the off state, the conductivity type of the substrate surface only under the gate electrode 13 is inverted to cause a channel 16 to be developed. In FIG. 4B, when only the transistor $Q_2$ is in the on state, a channel 17 appears only under the gate electrode 12. When the two transistors $Q_2$ and $Q_3$ are in the on state, channels 16 and 17 appear simultaneously. In this case, the two channels are substantially connected together, resulting in conduction between the regions 3' and 4'. In other words, this structure is equivalent to the series connection of two transistors.

Further advantages of the invention will become apparent by referring to FIG. 5 which shows equivalent circuits of the memory cell shown in FIG. 4. FIG. 5A shows a circuit of a memory cell having a common digit line 3 as in FIG. 1. Like constituent components are indicated by the indentical references in FIG. 1 and 5. As shown in FIG. 4, the gate electrodes 12 and 13 of transistors $Q_2$ and $Q_3$ are partly superposed on together with insulating film 14, therebetween, causing a capacitance $C_2$ to be present. Assume that the voltage $V_A$ is applied to the read address line 2 when the information stored in the capacitance $C_1$ is read. This causes the gate voltage $V_g$ of transistor $Q_3$ to increase by $\Delta V_g$, which is expressed as $$\Delta V_g = \frac{C_2}{C_1 + C_2} V_A \tag{1}$$

Further assume that a "high level" information is stored in the capacitance $C_1$. When the voltage of this "high level" is $V_H$, at the read cycle the gate voltage $V_g$ of transistor $Q_3$ is $V_g = V_H + \Delta V_g$. Generally, the current $I_D$ which flows through the transistor $Q_3$ is proportional to $(V_g - V_T)^2$, where $V_T$ is the threshold voltage of transistor $Q_3$. In the memory cell of the invention, therefore, the current $I_D$ is $(V_H + \Delta V_g - V_T)^2/(V_H - V_T)^2$ times as great as that in the prior art memory cell. In other words, the read time is decreased accordingly in the memory cell of the invention.

The invention will be described more concretely by way of example. Assume a memory cell comprising a p-type substrate 5 of 13Ω. cm in specific resistivity and n-channel type MOS transistors $Q_1$, $Q_2$ and $Q_3$, in which the substrate potential is −5 V, the write and read drive voltage is +12 V, the threshold voltage $V_T$ of the transistor $Q_3$ is 1 V, the thickness of the gate film 19 is 1000 A, the area of the gate electrode opposite to the substrate 5 is 70 $\mu^2$, the insulating film 14 between the gate electrodes 13 and 12 is 3500 A, and the area where the two gate electrodes are superposed on each another is 22 $\mu^2$. In this structure, the capacitance developed between the gate electrodes 12 and 13 is approximately 0.002 pF. The parasitic capacitance $C_1$ at the gate of the transistor $Q_3$ differs according to the state (on or off) of the transistor $Q_3$ due to influence such as by the depletion layer underneath the gate 13; the capacitance $C_{1ON}$ present when the transistor $Q_3$ is in the on state is approximately 0.03 pF, and the capacitance $C_{1OFF}$ present when it is in the off state is approximately 0.01 pF.

When an information of "high level" is stored in the memory, this "high level" can be generally detected at a minimum voltage of about 3 V. Hence, from Eq (1), the increment $\Delta V_g$ of the gate voltage $V_g$ by the capacitance $C_2$ is 0.86 V. Accordingly, the gate voltage $V_g$ is 3.86 V. As described above, therefore, the current $I_D$ is about twice as great in the memory cell of the invention as in the prior art cell. This signifies the fact that the memory cell of the invention makes about twice the current value $I_D$ for a minimum bit (3 V) of "high level", thereby increasing the readout speed accordingly.

Furthermore, the memory device of the invention contributes to raising the lower limit voltage of a stored information being qualified as the "high level". Therefore, since the data stored in the capacitance $C_1$ is lost due to leakage current, this effect serves to prolong the memory holding period.

During the period the memory cell stores a "low level", the transistor $Q_3$ must maintain its off state, or the state not to drive the following stage. As described, however, the gate voltage $V_g$ of the transistor $Q_3$ increases at read drive and if the transistor $Q_3$ sufficiently turns on due to the increment $\Delta V_g$ of the gate voltage $V_g$, this may lead to misoperation. To avoid this problem, the increment $\Delta V_g$ should not exceed $V_{gT}$, assuming that the transistor $Q_3$ becomes able to drive the following stage when its gate voltage exceeds $V_{gT}$. This condition is expressed as $$\frac{C_2}{C_1 + C_2} \cdot V_2 \leq V_{gT}$$

or $$C_2 \leq \frac{V_{gT}}{V_2 + V_{gT}} \cdot C_1$$

When $V_{gT} = 2$ V and $V_2 = 12$ V, then $C_2 \leq C_1/5$.

In this embodiment, $C_2 = 0.002$ pF and $C_{1OFF} = 0.01$ pF as described above, and hence the memory cell of the invention satisfies this condition.

FIG. 5B shows an equivalent circuit of a memory cell in which the common digit line 3 (FIG. 5A) is divided into a write digit line 3" and a read digit line 3'". This type of memory cell is widely in use. According to this embodiment, the drain of the transistor $Q_1$ is connected to the write digit line 3" and the drain of the transistor $Q_2$ is connected to the read digit line 3'". As shown in FIG. 8, the separated drains 3' of the transistors $Q_1$ and $Q_2$ are respectively connected to the digit lines 3" and 3'". Other arrangements of this memory cell are the same as those shown in FIG. 5A.

Methods of fabricating the device of the invention will be described by referring to FIGS 6 and 7.

Figure 6A:
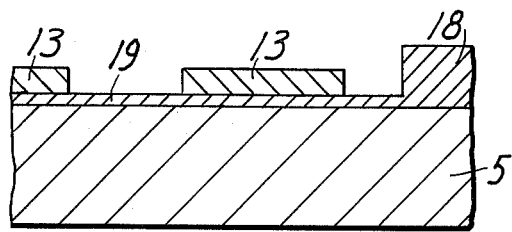

As shown in FIG. 6A, one surface of a single crystal semi-conductor substrate 5 is coated with a thick oxide film 18. Part of the oxide film 18 corresponding to the region comprising the source, drain and channel of the transistors is removed, a gate oxide film 19 is formed on the substrate 5 in the removed area, and polycrystalline silicon for the gate electrode of the transistor $Q_3$ is grown on the surface of the gate oxide film 19 to the desired shape of electrode 13.

Figure 6B:
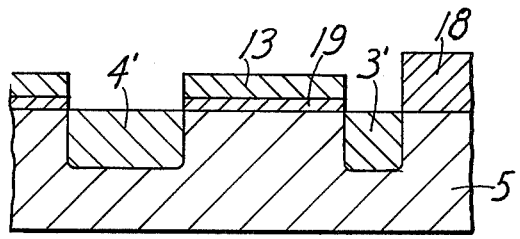

As shown in FIG. 6B, windows are formed by selectively etching the oxide film 19 with the polycrystalline silicon electrode 13 used as a mask. Through the windows, regions 3' and 4' are formed by diffusing or implanting impurities of a conductivity type opposite to that of the substrate 5.

Figure 6C:
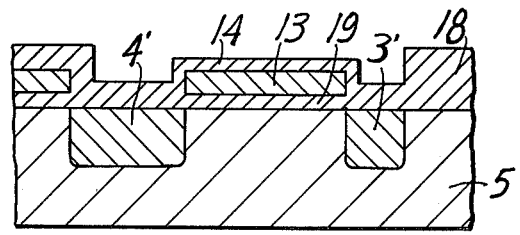

As shown in FIG. 6C, the surfaces of the polycrystalline silicon electrode 13 and diffusion regions 3' and 4' are coated with an oxide film 14 by thermal oxidation techniques.

Figure 6D:
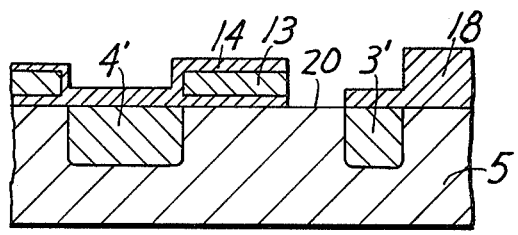
Figure 6E:
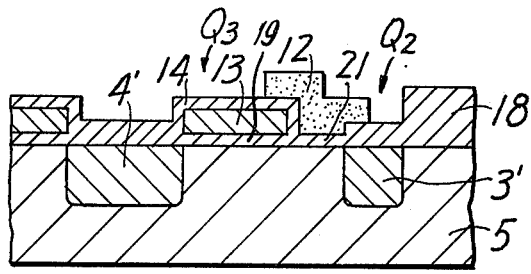

As shown in FIG. 6D, an opening 20 is formed on the substrate 5 in the area corresponding to the channel of the transistor $Q_2$ by photoresist techniques. Then, as shown in FIG. 6E, a gate oxide film 21 is grown in the area 20 by thermal oxidation, and a gate electrode 12 is formed of aluminum on the gate oxide film 21.

Another method of making the memory cell of the invention is illustrated in FIG. 7.

Figure 7A:
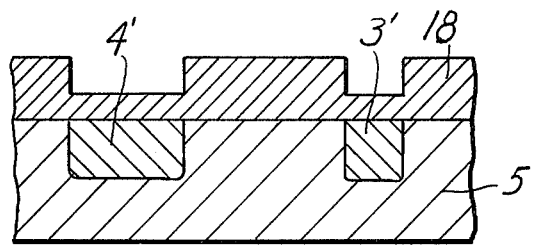

As shown in FIG. 7A, one surface of a single crystal semiconductor substrate 5 is coated with a thick oxide film 18. A part of of the oxide film 18 corresponding to diffusion regions 3' and 4' is removed, the diffusion regions 3' and 4' are formed by diffusion or implantation in the removed area on the substrate, and the surfaces of these regions are coated with an oxide film.

Figure 7B:
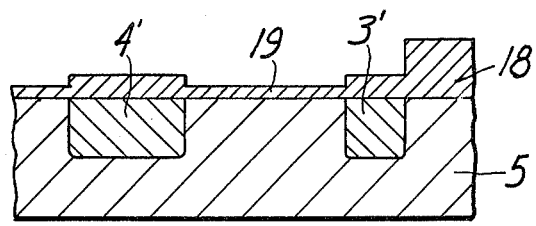

As shown in FIG. 7B, part of the oxide film 18 between the regions 3' and 4' is removed, and a gate oxide film 19 is formed in the removed area.

Figure 7C:
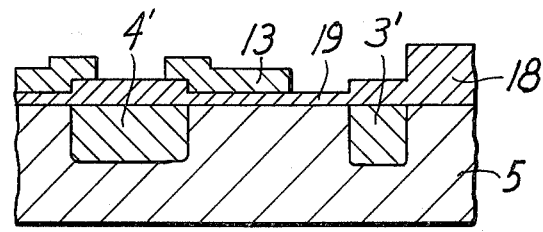

As shown in FIG. 7C, a polycrystalline silicon gate electrode 13 which is to serve as the gate electrode of the transistor $Q_3$ is formed on the gate oxide film 19.

Figure 7D:
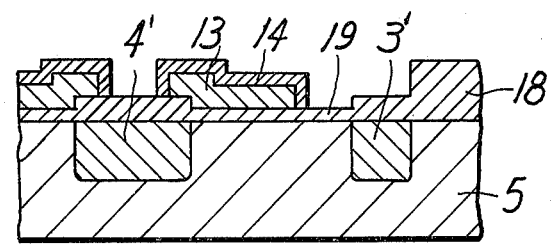
Figure 7E:
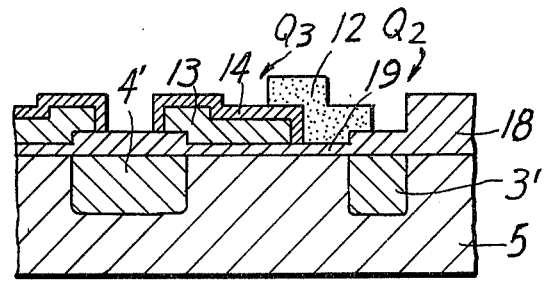

As shown in FIG. 7D, the surface of the gate electrode 13 is coated with an oxide film 14, and, as shown in FIG. 7E, as shown in FIG. 7E, an aluminum electrode 12, which is to serve as the gate electrode of the transistor $Q_2$, is formed over the gate oxide film 19 and oxide film 14.

According to the invention, as has been described, the gate electrodes 12 and 13 of transistors $Q_2$ and $Q_3$ are partly superposed on each another by way of the insulation layer 14 between the drain region 3' and the source region 4' without depending on the use of the conventional diffusion layer which serves as the common electrode, and thus the size of the structure of two serial transistors is reduced. Because the area occupied by the two serial transistors is reduced, integration is increased and the device of the invention is highly suited for applications to memory cells. Furthermore, the gate electrodes of the read transistor and the data storing transistor are partly superposed on each another, resulting in a capacitance at the gates, which serves to increase the operating speed of the memory cell.

Still further, the threshold voltages of the two transistors $Q_2$ and $Q_3$ can be differentiated from each another by differentiating the thickness of the gate insulation layer 19 in the area of electrode 12 from that in the area of electrode 13 (FIG. 4). This makes it possible to set the two threshold voltages to the desired values respectively.

What is claimed is:

1. A semiconductor integrated circuit device comprising a semiconductor substrate of a first conductivity type; first, second, third and fourth regions of a second conductivity type formed on one major surface of said substrate; a first insulating film formed on said surface of said substrate between said first and second regions; a first electrode formed on said first insulating film; a second insulating film formed on said surface of said substrate between said third and fourth regions; a second electrode formed on said second insulating film and extending from an area above the edge of said third region to an area above said surface of said substrate intermediate said third and fourth regions; a third electrode formed on said second insulating film and extending from an area above the edge of said fourth region to an area above said surface of said substrate intermediate said third and fourth regions; said second and third electrodes being partly superposed on each other, a third insulating film interposed between the superposed portions of said second and third electrodes, means for connecting said second region to said second electrode; a write address line connected to said first electrode; and a read address line connected to said third electrode; a first capacitance being formed by said second and third electrodes and said third insulating film between said second and third electrodes; and a second capacitance being formed between said second electrode and said substrate; wherein an information on said first region is stored in said second capacitance.

2. The semiconductor integrated memory circuit device as claimed in claim 1, further comprising a digit line connected to said first and fourth regions.

3. The semiconductor integrated memory circuit device as claimed in claim 1, further comprising a write digit line connected to said first region, and a read digit line connected to said fourth region.

* * * * *